United States Patent [19]

Halman et al.

[11] Patent Number: 5,658,425
[45] Date of Patent: Aug. 19, 1997

[54] METHOD OF ETCHING CONTACT OPENINGS WITH REDUCED REMOVAL RATE OF UNDERLYING ELECTRICALLY CONDUCTIVE TITANIUM SILICIDE LAYER

[75] Inventors: Mark Halman, Oakland; Paul Rhoades, Mountainview; David Kerr, Santa Clara, all of Calif.

[73] Assignee: LAM Research Corporation, Fremont, Calif.

[21] Appl. No.: 474,003

[22] Filed: Jun. 7, 1995

Related U.S. Application Data

[63] Continuation of Ser. No. 165,914, Dec. 14, 1993, abandoned, which is a continuation-in-part of Ser. No. 777,611, Oct. 16, 1991, Pat. No. 5,269,879.

[51] Int. Cl.$^6$ ............................................. H01L 21/00
[52] U.S. Cl. ........................... 438/620; 438/695; 438/723; 438/626; 438/629; 438/637
[58] Field of Search .................... 156/643.1, 646.1, 156/653.1, 657.1

[56] References Cited

U.S. PATENT DOCUMENTS

| | | | |
|---|---|---|---|
| 4,407,850 | 10/1983 | Bruce et al. | 427/579 |
| 4,473,436 | 9/1984 | Beinvogl | 156/643.1 |
| 4,617,079 | 10/1986 | Tracy et al. | 156/345 |
| 4,784,720 | 11/1988 | Douglas | 156/643.1 |
| 4,844,773 | 7/1989 | Lowenstein et al. | 156/643.1 |
| 4,908,333 | 3/1990 | Shimokawa et al. | 437/195 |
| 4,948,459 | 8/1990 | Van Laarhoven et al. | 156/643.1 |
| 4,948,462 | 8/1990 | Rossen | 156/643.1 |
| 4,973,381 | 11/1990 | Palmer | 156/643.1 |
| 4,978,420 | 12/1990 | Bach | 156/643 |
| 4,981,550 | 1/1991 | Huttemann et al. | 156/643.1 |
| 5,006,485 | 4/1991 | Villalon | 437/195 |
| 5,021,121 | 6/1991 | Groechel et al. | 156/643.1 |
| 5,022,958 | 6/1991 | Favreau et al. | 156/643.1 |
| 5,176,790 | 1/1993 | Arleo et al. | 156/643.1 |
| 5,284,549 | 2/1994 | Barnes et al. | 156/662.1 |

*Primary Examiner*—Thi Dang
*Attorney, Agent, or Firm*—Burns, Doane, Swecker & Mathis, L.L.P.

[57] ABSTRACT

A process for etching of silicon oxide such as silicon dioxide, or oxynitride. The process includes etching a silicon oxide layer to expose an underlying electrically conductive titanium silicide layer and provide a contact opening extending through the silicon oxide layer to the electrically conductive titanium silicide layer. The etching is performed by exposing the silicon oxide layer to an etching gas in an ionized state in a reaction chamber of a plasma generating device. The etching gas includes a fluoride-containing gas and a passivating nitrogen gas which is present in an amount effective to suppress a removal rate of the electrically conductive titanium silicide layer when it is exposed to the etching gas during the etching step. The fluoride-containing gas can be $CF_4$, $CHF_3$, $C_2F_6$, $CH_2F_2$, $SF_6$, other Freons and mixtures thereof. The etching gas can also include a carrier gas such as Ar, He, Ne, Kr or mixtures thereof. The etching can be reactive ion etching or plasma etching and the etching gas can be exposed to a microwave electric field and/or a magnetic field during the etching step. The etching gas reduces the amount of the titanium silicide layer etched during overetching thereof compared to the same etching gas without nitrogen.

26 Claims, 1 Drawing Sheet

1

METHOD OF ETCHING CONTACT OPENINGS WITH REDUCED REMOVAL RATE OF UNDERLYING ELECTRICALLY CONDUCTIVE TITANIUM SILICIDE LAYER

This application is a continuation of application Ser. No. 08/165,914, filed Dec. 14, 1993 abandoned, a continuation-in-part, of application Ser. No. 07/777,611, filed Oct. 16, 1991 now U.S. Pat. No. 5,269,879.

FIELD OF THE INVENTION

The invention relates to an improved plasma etching and reactive ion etching process for providing contact openings in semiconductor composites.

BACKGROUND OF THE INVENTION

U.S. Pat. No. 4,973,381 ("Palmer") discloses a process for etching a semiconductor surface with excited gas which is drawn out by a pressure differential through an output opening in a glass or quartz container toward a surface to be etched. The container is placed in a vacuum enclosure at a pressure of $10^{-4}$ to $10^{-5}$ Torr. The excited species can be a mixture of $CCl_4$ and $O_2$ or an active species such as fluorine and a buffer gas such as He, Ar or N.

In Palmer, plasma ions reunite prior to exiling the container and the etching gas will not be in an ionized state when it contacts the wafer.

U.S. Pat. No. 4,978,420 ("Bach") discloses etching vias in a dual-layer comprising $SiO_2$ and silicon nitride. In Bach, the photoresist and nitride layers are etched simultaneously with an etching gas which includes $CF_4$ or $SF_6$, oxygen and argon and the oxide is etched with the same gases except for the absence of oxygen. The power in the plasma reactor is set at 325-350 Watts during the nitride etch and increased to 375 Watts for the oxide etch. A tungsten layer is provided beneath the oxide to resist overetching since W is highly resistant to the oxide etch.

U.S. Pat. No. 4,981,550 ("Huttemann") discloses a process for etching W by exposing a layer of W and a buffer layer to the etching plasma. Huttemann discloses that the buffered layer can be Al and an inert gas such as Ar can be used to sputter clean the buffer layer simultaneously with the plasma etch.

U.S. Pat. No. 4,948,462 ("Rossen") discloses a process for etching W by exposing a W layer to $SF_6$, $N_2$ and $Cl_2$ etching gases.

U.S. Pat. No. 4,617,079 ("Tracy") discloses plasma etching of $SiO_2$ with 200 sccm Ar, 40 sccm $CF_4$ and 40 $CHF_3$.

U.S. Pat. No. 4,407,850 ("Bruce") discloses anisotropic etching of a photoresist under plasma conditions at pressures above those used in reactive ion etching. In particular, etching at rates of 2000 to 300 Å/min was obtained using pressures of 0.3 to 2 Torr and reactive gases $O_2$ and Ar. The background of Bruce mentions that planarizing of rough surface topography allows better focusing using optics with small depths of field. In Bruce, a silicon wafer is coated with a layer of thermal oxide, a 1 µm layer of resist (planarizing layer), a masking layer (1000 Å $SiO_2$) and a 0.5 µm (5000 Å) layer of photoresist. Bruce discloses that the planarizing layer can be Shipley AZ 1350 photoresist.

In prior art plasma etching and reactive ion etching ("RIE") of silicon oxide a fluorinated gas is used as the etching gas. A problem with this type of etching has been sputtering of metal layers and deposition of an organometallic polymer (a carbon-fluorine based polymer which includes the underlying metal) on sidewalls of vias formed during the etching process. Such deposits of organometallic polymer on the sidewalls of the via and photoresist are difficult to remove.

The above problem is even worse when the semiconductor composite includes multiple layers of metal interconnects since dielectric planarization creates various dielectric thicknesses and the etch time to form the contact openings and vias is based on the thickest oxide step. As a result, the electrical conductor (e.g. metals such as aluminum or silicides such as silicon, polysilicon and titanium silicide) underlying the thinner oxide steps is exposed to the etching gas for a longer time thus producing more sputtering and/or removal of the electrical conductor at that location than the electrical conductor underlying the thicker oxide steps.

In etching silicon oxide, the fluorinated gas reacts with the oxide to form volatile silicon difluoride or silicon tetrafluoride and carbon monoxide or carbon dioxide. In the case where titanium silicide is the underlying electrical conductor, the titanium silicide is not volatile but is eroded by the action of sputtering of the ionized gas. Accordingly, there exists a need in the art for an etch process which can open contacts of various oxide depths while preserving the underlying titanium silicide. By preserving the titanium silicide low contact resistance of the contact metal deposited onto the titanium silicide can be ensured.

SUMMARY OF THE INVENTION

The invention provides a process for etching of silicon oxide by providing a composite comprising an electrically conductive titanium silicide layer and a layer of silicon oxide and etching the silicon oxide layer with an etching gas in an ionized state to expose the electrically conductive titanium silicide layer and form a contact opening extending through the silicon oxide layer to the electrically conductive layer. The etching is performed with an etching gas in a reaction chamber of a plasma generating device, the etching gas including a fluoride-containing gas and a passivating nitrogen gas, the passivating nitrogen gas being present in an amount effective to suppress erosion of the electrically conductive titanium silicide layer. The passivating gas preferably is $N_2$ and the etching can comprise plasma etching or reactive ion etching. The etching gas can be exposed to a microwave electric field, a magnetic field or both.

According to various aspects of the invention, the silicon oxide layer can comprise a silicon dioxide or oxynitride layer. The fluoride-containing gas can comprise $CF_4$, $CHF_3$, $C_2F_6$, $CH_2F_2$, $SF_6$ and/or other Freons and mixtures thereof. The etching gas can also include a carrier gas such as Ar, He, Ne, Kr or mixtures thereof. The etching gas is preferably oxygen free, i.e., the etching gas excludes oxygen gas.

The process of the invention can include a step of planarizing the silicon oxide layer, forming a photoresist layer on the silicon oxide, patterning the photoresist layer to form a plurality of contact openings and forming contacts by depositing metal on the etched composite so as to fill the openings.

DETAILED DESCRIPTION OF THE PREFERRED EMBODIMENTS

Figure 1:
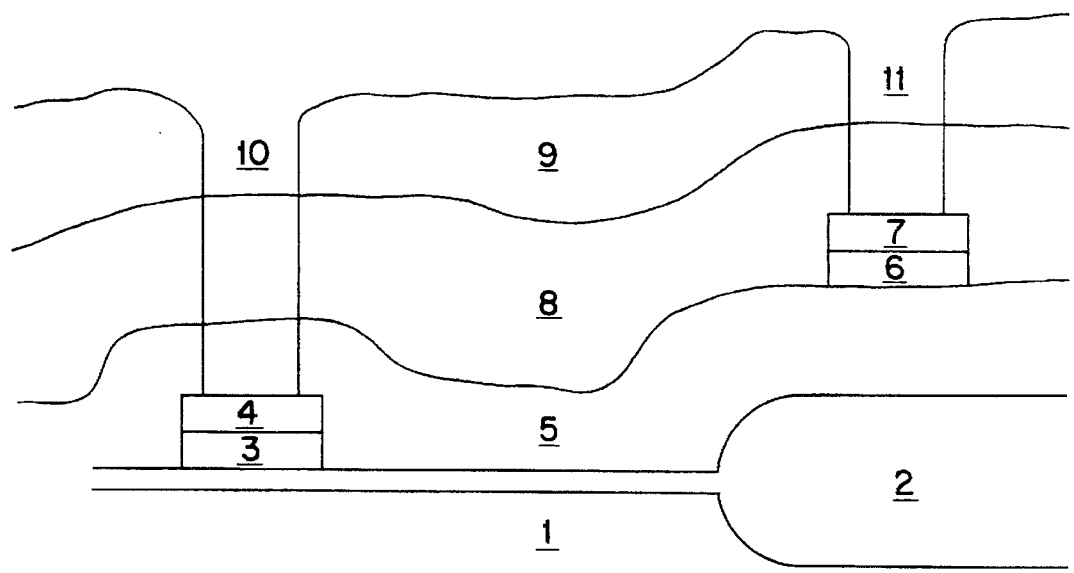
FIG. 1 shows a sectional view of a semiconductor composite which has been processed according to the invention to include contact openings in a multilevel polysilicon/silicide.

The invention provides a process which suppresses erosion of titanium silicide during etching of contact openings in semiconductor composites.

According to the invention, a process is provided for etching a layer of silicon oxide in a semiconductor composite. In particular, the semiconductor composite includes an electrically conductive titanium silicide layer underlying the silicon oxide layer. The etching exposes the electrically conductive titanium silicide layer and provides a contact opening extending through the silicon oxide layer to the electrically conductive titanium silicide layer. The etching is performed by exposing the silicon oxide layer to an etching gas in an ionized state in a reaction chamber of a plasma generating device. The etching gas includes a fluoride-containing gas and a passivating gas. The passivating gas is present in an amount effective to suppress sputtering of the electrically conductive titanium silicide layer when it is exposed to the etching gas.

As the packing density of semiconductor devices shrinks and device requirements grow, multiple layers of metal interconnects are becoming more common. The use of dielectric planarization is necessary due to step coverage issues and subsequent metal cracking issues. The introduction of a planarization step, however, creates various dielectric thicknesses within the circuit. Contact to the underlying metal is made by etching openings in the dielectric to the silicon, polysilicon and silicide and filling the openings with an electrically conductive material to form contacts.

When etching the dielectric to form a functional contact opening, an etch time based on the thickest oxide step is necessary. This means that the titanium silicide under the thinnest dielectric is typically exposed to the etching gas for 50–70% of the total etch time. With the typical thickness of the titanium silicide being only about 1000 Å, a low removal or sputter rate is required. It is important to preserve a layer of silicides at the bottom of the contact to achieve low electrical contact resistance.

Reactive ion etching ("RIE") and plasma etching ("PE") are common methods used to open contacts anisotropically through the dielectric to the conductor. The basic difference between the two etch modes is pressure. That is, RIE is typically below 50 mTorr and PE is typically above 50 mTorr. The conductor erosion problem exists with either mode of etching.

To form contacts in silicon oxide such as silicon dioxide ($SiO_2$), a fluorinated gas such as $CF_4$, $CHF_3$, $CH_2F_2$, $CH_3F$, $C_2F_6$, $SF_6$, $C_nF_{n+4}$ or other Freon and mixtures thereof is used in the plasma reactor. The fluorinated gas dissociates and reacts with the silicon oxide to form volatile silicon difluoride or silicon tetrafluoride and carbon monoxide or carbon dioxide. A carrier gas such as He, Ne, Ar and Kr may be added to improve the etch rate of the silicon oxide by providing additional ion bombardment energy to break the strong silicon-oxygen bond. The energy needed to break the silicon-oxygen bond is on the order of 200 kcal/mole. The underlying material also experiences this ionic impact. The underlying material can sputter or react depending on its composition. The invention disclosed in parent application Ser. No. 07/777,611 overcomes this problem by adding a passivating gas to the etching gas. Applicants have discovered that the etchant gas chemistry disclosed in the parent application also provides a solution to excessive etching which occurs when etching a pattern through silicon dioxide to an underlying titanium silicide layer.

According to the process of the invention, contact openings of various depths on the circuit can be opened while suppressing the erosion and thus loss of the titanium silicide. In particular, the passivating gas comprises nitrogen. The nitrogen passivates the underlying titanium silicide electrically conducting layer. It is believed that the nitrogen may combine with the metal to form non-volatile TiN which will sputter at a slower rate than titanium. It is also believed that the nitrogen reacts with carbon in the feed gas to free up F and thereby increase the etch rate of the dielectric. The etching gas of the invention can reduce the amount of etching of the titanium silicide layer by 70% or more compared to etching carried out with an etching gas composition free of the passivating $N_2$ gas.

Figure 2:
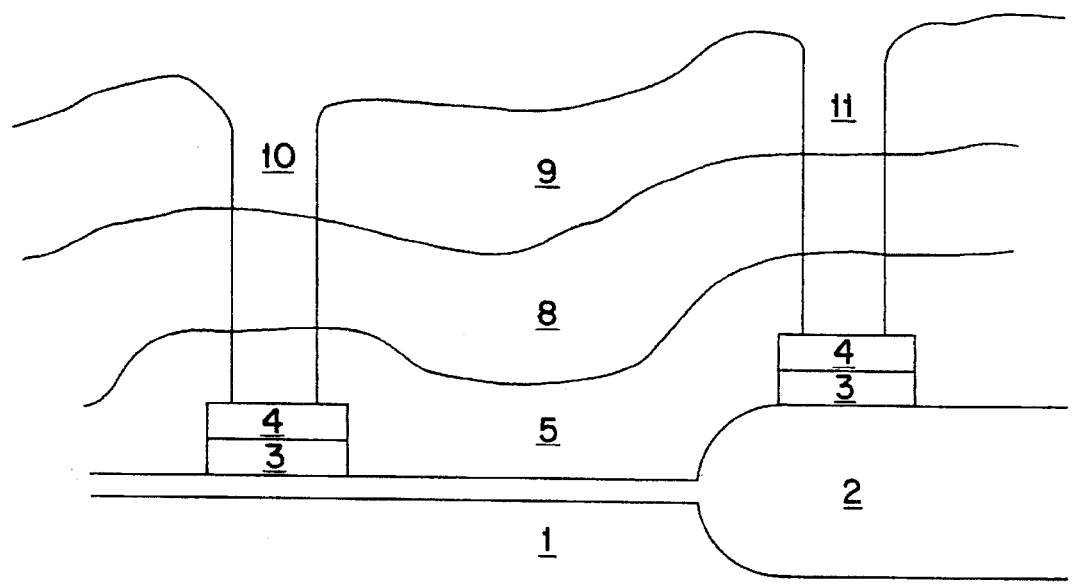
FIG. 2 shows a sectional view of a semiconductor composite which has been processed to include contact openings in a single level polysilicon/silicide according to the invention.

FIG. 1 shows a multilevel integrated circuit design which includes a substrate 1 such as silicon containing doped regions, a field oxide 2 such as a thermally grown silicon dioxide, a first polysilicon layer 3 such as a gate or conductor line, a first $TiSi_x$ layer 4, a first dielectric layer 5 such as silicon dioxide such as TEOS or BPSG, a second polysilicon layer 6 such as a gate or conductor line, a second $TiSi_x$ layer 7, a second dielectric layer 8 such as silicon dioxide (e.g. TEOS) or BPSG, a patterned photoresist layer 9, a deep contact opening 10 and a shallow contact opening 11. FIG. 2 is similar to FIG. 1 but shows a single level integrated circuit design. The layers 2–8 in the circuits shown in FIGS. 1 and 2 can be made by conventional techniques such as these disclosed in U.S. Pat. No. 5,022,958, the disclosure of which is hereby incorporated by reference.

The etching in accordance with the invention can comprise reactive ion etching typically carried out at pressures of 50 mTorr or less or plasma etching typically carried out at pressures above those used for reactive ion etching. In either case, the etching gas is in an ionized state when it contacts the semiconductor surface being etched. The etching gas includes a fluoride-containing gas and the passivating gas. The fluoride-containing gas can comprise $CF_4$, $CHF_3$, $C_2F_6$, $CH_2F_2$, $SF_6$ or other Freons and mixtures thereof. The etching gas can also include a carrier gas such as Ar, He, Ne, Kr or mixtures thereof. For example, the etching gas can include an effective amount up to 5 volume % $N_2$, 75 to 80 volume % Ar, about 8 volume % $CF_4$ and about 12 volume % $CHF_3$. The etching gas can be exposed to a microwave electric field and/or a magnetic field during the etching step.

The flow rates of the various constituents of the etching gas are controlled to provide suitable etching while suppressing removal of the electrically conductive layers 4 and 7. For instance, the flow rate of the nitrogen can be as low as 2 sccm and the flow rate of the fluoride-containing gas can be 10 to 100, preferably 40 to 60 sccm. The amount of nitrogen added to the etch gas should be enough to suppress overetching of the titanium silicide. Although there is no upper limit on the amount of nitrogen which can be added to the gas due to the highly reactive nature of the nitrogen with components of the etching apparatus, the maximum amount of nitrogen should be controlled to prevent the equipment from wearing out and/or slowing the etching of the silicon dioxide layer to an undesirable level. The carrier gas is optional. For instance, if argon is the carrier gas, it can be added in any amount such as 1 l/min (1000 sccm). In a typical contact etching process, the oxide can be etched through in about one minute and overetching of the titanium silicide can be greatly reduced such as by 70% with an etchant gas of 75 volume % Ar, 8 volume % $CF_4$ and 12 volume % $CHF_3$ and 5 volume % $N_2$ compared to an etchant gas of 80 volume % Ar, 8 volume % $CF_4$ and 12 volume % $CHF_3$. In accordance with the invention, by adding nitrogen to the etching gas, it is possible to effectively prevent removal of the titanium silicide underlying electrically conducting layer during the oxide etch.

The process of the invention can also include steps of forming a photoresist layer on the silicon oxide layer and patterning the photoresist layer to form a plurality of openings where contacts are required. The etching step forms contact openings in the silicon oxide layer corresponding to the openings in the photoresist layer. Also, the process of the invention can include a step of planarizing the silicon oxide layer prior to the etching step. In this case, the silicon oxide layer can be etched and/or covered with a photoresist or spin-on glass to achieve planarization. Furthermore, as explained with reference to FIGS. 1 and 2, the process of the invention can include depositing single level or multilevel electrically conductive layers so as to provide first and second regions thereof which are spaced apart and at different levels. In this case, the planarizing step decreases thicknesses of the silicon oxide layer such that the silicon oxide layer is thicker above the first region than above the second region, as shown in FIGS. 1 and 2. The process can also include a step of forming contacts by depositing metal on the composite after the etching step so as to fill the contact openings with metal.

While the invention has been described with reference to the foregoing embodiments, various changes and modifications can be made thereto which fall within the scope of the following claims.

What is claimed is:

1. A process for reducing etching of an underlying titanium silicide layer during etching of an overlying silicon oxide layer, comprising the steps of:

providing a semiconductor composite comprising an electrically conductive titanium silicide layer underlying a layer of silicon oxide; and etching the silicon oxide layer to expose the electrically conductive titanium silicide layer and provide a contact opening extending through the silicon oxide layer to the electrically conductive titanium silicide layer, the etching being performed by exposing the silicon oxide layer to an etching gas in an ionized state in a reaction chamber of a plasma generating device, the etching gas including a fluoride-containing gas and a nitrogen containing gas, the nitrogen containing gas being present in an amount effective to suppress a removal rate of the electrically conductive titanium silicide layer by forming non-volatile TiN when the titanium silicide layer is exposed to the etching gas during the etching step.

2. The process of claim 1, wherein the nitrogen containing gas comprises $N_2$.

3. The process of claim 2, wherein the etching gas consists essentially of the fluoride-containing gas and the $N_2$ gas.

4. The process of claim 2, wherein the etching gas includes a carrier gas selected from the group consisting of Ar, He, Ne, Kr or mixtures thereof.

5. The process of claim 2, further comprising depositing metal on the composite after the etching step so as to fill the contact opening with metal.

6. The process of claim 1, further comprising steps of forming a photoresist layer on the silicon oxide layer, patterning the photoresist layer to form a plurality of openings therein and the etching step forms contact openings in the silicon oxide layer corresponding to the openings in the photoresist layer.

7. The process of claim 6, further comprising a step of planarizing the silicon oxide layer prior to forming the photoresist layer.

8. The process of claim 7, further comprising a step of depositing the electrically conductive titanium silicide layer and etching the titanium silicide layer to form first and second regions thereof which are laterally spaced apart and at different vertical levels, the planarizing step decreasing thicknesses of the silicon oxide layer such that the silicon oxide layer is thicker above the first region than above the second region.

9. The process of claim 7, further comprising a step of depositing the electrically conductive titanium silicide layer and etching the titanium silicide layer to form a first region, depositing the silicon oxide layer over the first region, depositing a second layer of titanium silicide and etching the second layer of titanium silicide to form a second region such that the first and second regions are laterally spaced apart and at different vertical levels, depositing a second layer of silicon oxide over the second region and the planarizing step decreasing thicknesses of the second silicon oxide layer such that a total thickness of the silicon oxide layers above the first region is thicker than the second silicon oxide layer above the second region.

10. The process of claim 1, wherein the silicon oxide layer comprises a silicon dioxide layer.

11. The process of claim 1, wherein the etching step comprises plasma etching.

12. The process of claim 1, wherein the electrically conductive layer comprises a single level of titanium silicide.

13. The process of claim 1, wherein the electrically conductive layer comprises multilevels of titanium silicide.

14. The process of claim 1, wherein the fluoride-containing gas comprises a gas selected from the group consisting of $CF_4$, $CHF_3$, $CH_3F$, $C_2F_6$, $CH_2F_2$, $SF_6$, $C_nF_{n+4}$ and mixtures thereof.

15. The process of claim 1, wherein the etching gas is exposed to a microwave electric field during the etching step.

16. The process of claim 1, wherein the etching gas is exposed to a magnetic field during the etching step.

17. The process of claim 1, wherein the etching gas is exposed to a microwave electric field and a magnetic field during the etching step.

18. The process of claim 1, wherein the passivating gas comprises $N_2$ and during the etching step a flow rate of the $N_2$ is at least 2 sccm and a flow rate of the fluoride-containing gas is 10 to 100 sccm.

19. The process of claim 1, further comprising a step of planarizing the silicon oxide layer prior to the etching step.

20. The process of claim 1, wherein the etching gas includes 2 to 5 volume % of the nitrogen containing gas.

21. The process of claim 1, wherein the etching is performed while maintaining pressure in the reaction chamber at $\leq 50$ mTorr.

22. A process for reducing etching of an underlying titanium silicide layer during etching of an overlying silicon oxide layer, comprising the steps of:

providing a semiconductor composite comprising an electrically conductive titanium silicide layer underlying a layer of silicon oxide; and etching the silicon oxide layer to expose the electrically conductive titanium silicide layer and provide a contact opening extending through the silicon oxide layer to the electrically conductive titanium silicide layer, the etching being performed by exposing the silicon oxide layer to an etching gas in an ionized state in a reaction chamber of a plasma generating device, the etching gas including a fluoride-containing gas and a nitrogen containing gas, the nitrogen containing gas being present in an amount effective to suppress a removal rate of the electrically conductive titanium silicide layer by forming non-volatile TiN when the titanium silicide layer is exposed to the etching gas during the etching step, the amount of the nitrogen containing gas not exceeding 25% of a total mount by volume of the fluoride-containing gas.

23. The process of claim 22, wherein the etching gas includes 2 to 5 volume % of the nitrogen containing gas.

24. A process for reducing etching of an underlying titanium silicide layer during etching of an overlying silicon oxide layer, comprising the steps of:

providing a semiconductor composite comprising an electrically conductive titanium silicide layer underlying a layer of silicon oxide; and etching the silicon oxide layer to expose the electrically conductive titanium silicide layer and provide a contact opening extending through the silicon oxide layer to the electrically conductive titanium silicide layer, the etching being performed by exposing the silicon oxide layer to an etching gas in an ionized state in a reaction chamber of a plasma generating device, the etching gas including a fluoride-containing gas and a nitrogen containing gas, the nitrogen containing gas being present in an amount effective to suppress a removal rate of the electrically conductive titanium silicide layer when it is exposed to the etching gas during the etching step, the etching step comprising reactive ion etching at a pressure of $\leq 50$ mTorr.

25. A process for reducing etching of an underlying titanium silicide layer during etching of an overlying silicon oxide layer, comprising the steps of:

providing a semiconductor composite comprising an electrically conductive titanium silicide layer underlying a layer of silicon oxide; and etching the silicon oxide layer to expose the electrically conductive titanium silicide layer and provide a contact opening extending through the silicon oxide layer to the electrically conductive titanium silicide layer, the etching being performed by exposing the silicon oxide layer to an etching gas in an ionized state in a reaction chamber of a plasma generating device, the etching gas including a fluoride-containing gas and a nitrogen containing gas, the nitrogen containing gas being present in an amount effective to suppress a removal rate of the electrically conductive titanium silicide layer when it is exposed to the etching gas during the etching step, the etching gas including a mixture of about 75 volume % Ar, about 8 volume % $CF_4$ about 12 volume % $CHF_3$, and about 5 volume % $N_2$.

26. A process for reducing etching of an underlying titanium silicide layer during etching of an overlying silicon oxide layer, comprising the steps of:

providing a semiconductor composite comprising an electrically conductive titanium silicide layer underlying a layer of silicon oxide; and etching the silicon oxide layer to expose the electrically conductive titanium silicide layer and provide a contact opening extending through the silicon oxide layer to the electrically conductive titanium silicide layer, the etching being performed by exposing the silicon oxide layer to an etching gas in an ionized state in a reaction chamber of a plasma generating device, the etching gas including a fluoride-containing gas and a nitrogen containing gas, the nitrogen containing gas being present in an amount effective to suppress a removal rate of the electrically conductive titanium silicide layer by forming non-volatile TiN when the titanium silicide layer is exposed to the etching gas during the etching step, the titanium silicide layer including first and second regions which are laterally spaced apart and at different vertical levels.

* * * * *